(12) United States Patent
Lin

(10) Patent No.: US 8,451,151 B2
(45) Date of Patent: May 28, 2013

(54) SUCCESSIVE APPROXIMATION ANALOG TO DIGITAL CONVERTER WITH CAPACITOR MISMATCH CALIBRATION AND METHOD THEREOF

(75) Inventor: Jin-Fu Lin, Tainan (TW)

(73) Assignee: Himax Technologies Limited, Tainan (TW)

( * ) Notice: Subject to any disclaimer, the term of this patent is extended or adjusted under 35 U.S.C. 154(b) by 95 days.

(21) Appl. No.: 13/210,229

(22) Filed: Aug. 15, 2011

(65) Prior Publication Data

US 2013/0044014 A1    Feb. 21, 2013

(51) Int. Cl.
*H03M 1/00*    (2006.01)

(52) U.S. Cl.
USPC ........... 341/110; 341/117; 341/118; 341/119; 341/120; 341/155; 341/172

(58) Field of Classification Search
USPC .................. 341/118–120, 172, 155, 156, 110
See application file for complete search history.

(56) References Cited

U.S. PATENT DOCUMENTS

| 4,399,426 | A  | * | 8/1983 | Tan | 341/120 |
| 5,684,487 | A  | * | 11/1997 | Timko | 341/172 |
| 6,400,302 | B1 | * | 6/2002 | Amazeen et al. | 341/172 |
| 6,707,403 | B1 | * | 3/2004 | Hurrell | 341/120 |

\* cited by examiner

*Primary Examiner* — Jean B Jeanglaude
(74) *Attorney, Agent, or Firm* — Stout, Uxa, Buyan & Mullins, LLP

(57) ABSTRACT

A capacitance mismatch calibrating method for a successive approximation register ADC which includes at least one array of capacitors is provided. The method includes the following steps: firstly, at least two compensating capacitors are configured. A capacitor from the array of capacitors is selected as a capacitor-under-test. Then, the terminal voltages on the terminals of the array of capacitors and on the terminals of the compensating capacitors are determined. A first comparison voltage is outputted based on the determined terminal voltages. Afterwards, a sequence of comparisons is controlled based on the first comparison voltage and a second comparison voltage to output a sequence of corresponding digital bits. Finally, a calibration value is calculated to calibrate the value of a capacitor-under-test according to the digital bits.

12 Claims, 9 Drawing Sheets

$C7 = 2C6 = 4C5 = 8C4 = 16C3 = 32C2 = 64C1 = 64C0 = 32C_{2C} = 64C_{1C}$

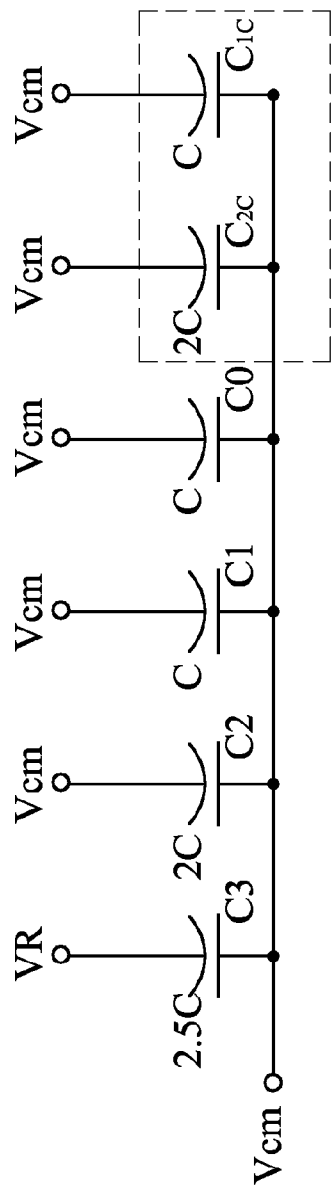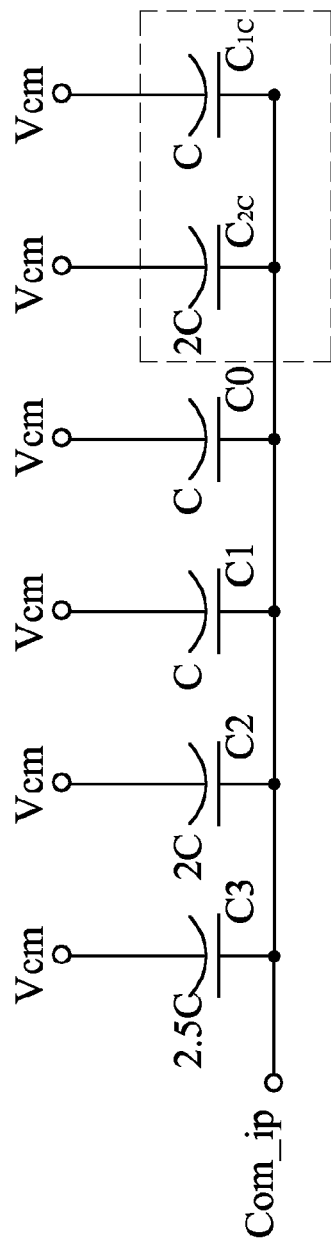

comparison phase 2 comparison phase 3

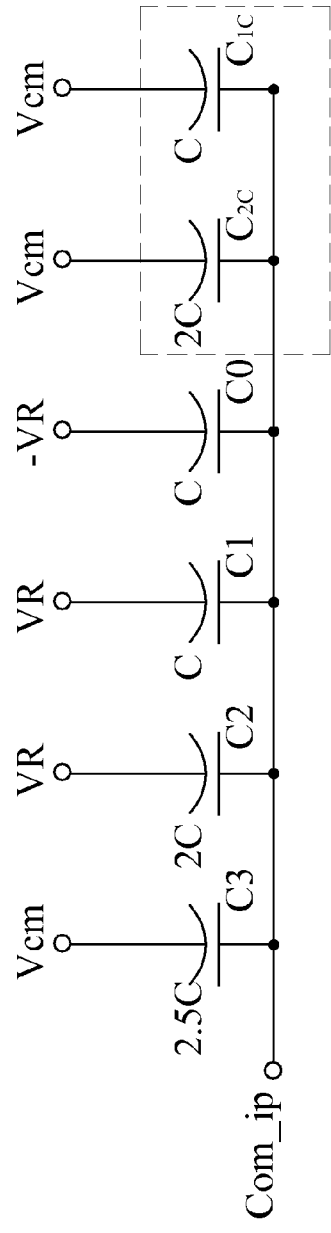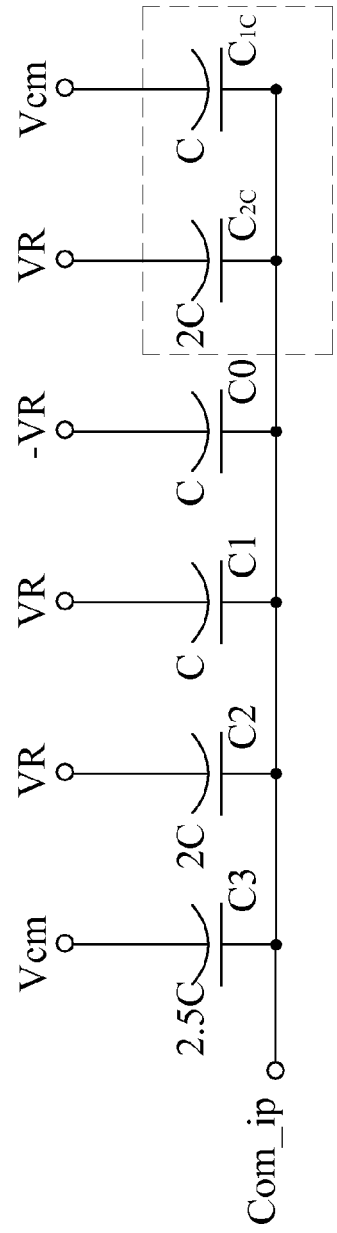

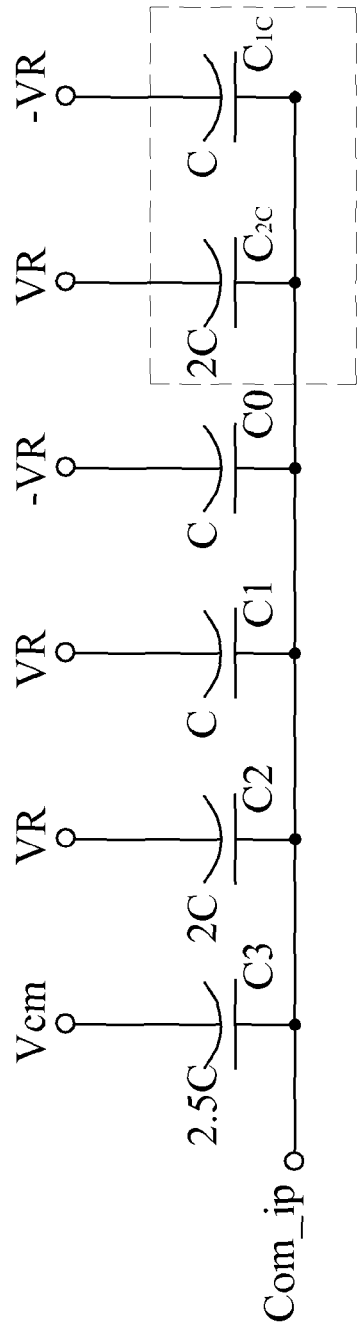

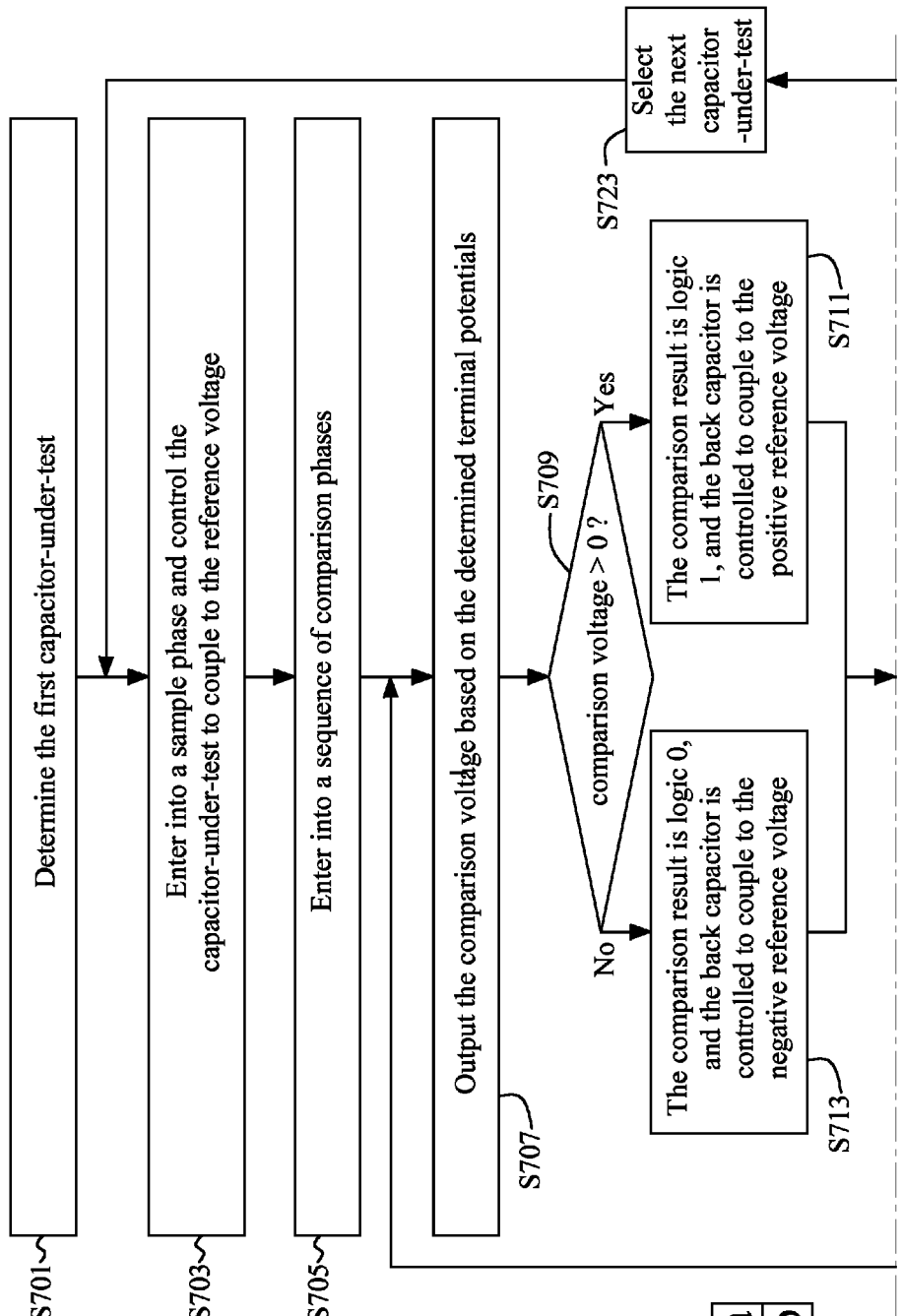

SUCCESSIVE APPROXIMATION ANALOG TO DIGITAL CONVERTER WITH CAPACITOR MISMATCH CALIBRATION AND METHOD THEREOF

BACKGROUND OF THE INVENTION

1. Field of the Invention

The present invention generally relates to a successive approximation register (SAR) ADC, and more particularly to a successive approximation ADC with capacitance mismatch calibration and method thereof.

2. Description of Related Art

In integrated circuits (IC), capacitance match is always one of the important design considerations. In ICs, such as analog to digital converters (ADCs) and switch-capacitor circuits, the performance of the circuits might be restricted due to capacitance mismatch resulting from deviation in the manufacturing process, such that the circuit cannot achieve the level of the original design.

FIG. 1 illustrates an 8-bit successive approximation register (SAR) analog-to-digital converter (ADC). As shown in FIG. 1, SAR ADC 1 includes two symmetrical digital to analog converters (DACs) 11, 13 which both consist of an array of capacitors (C7 to C0) with binary weighted values. In operation, a comparator 15 first samples and compares the differential input voltages Vip, Vin, and a SAR control logic ("SAR") 17 switches the switches $S_{7p}$, $S_{7n}$ to control the terminal voltages on the terminals of the capacitors C7 based on a comparison result of the comparator 15. Due to the change of the terminal voltages, the redistributed charges generate new voltages on the two terminals of the DACs 11, 13. Then, the comparator 15 compares the outputs of the DACs 11, 13 sequentially, and the SAR 17 converts the corresponding digital bits (B1 to B8) based on the comparison result of the comparator 15.

The converted digital bits (Bi) can be used to generate a digital output according to the binary-weighted capacitors (Ci). With reference to the depiction of FIG. 2A, taking the 3-bit successive SAR ADC as an example, under perfect capacitance matching, the values of the binary-weighted capacitors C3-C0 should be 4C, 2C, C, C precisely, respectively. After converting the digital bits B3-B1, the digital output (Dout) can be generated by equation (1).

$$Dout=4*B3+2*B2+B1 \quad (1)$$

However, due to deviation in the manufacturing process, the capacitance of the capacitor C3 might not equal 4C, as shown in FIG. 2B. Therefore, the digital output calculated with incorrect weighted values of the capacitors is not precise, such that the circuit cannot operate regularly. In order to decrease capacitance mismatch effect, it usually increases the capacitances of the array of capacitors in the circuit, which results in more power consumption and reducing the operating speed of overall SAR ADC.

Therefore, with IC design, a need has arisen to propose a novel circuit which can compensate for or calibrate the capacitance mismatch caused by deviation in the manufacturing process with relatively small capacitance, so as to enable the designed circuit to achieve the original performance and precision.

SUMMARY OF THE INVENTION

In view of the foregoing, it is an object of the present invention to provide a successive approximation register (SAR) ADC, which can compensate for or calibrate the capacitance mismatch caused by deviation in the manufacturing process with relatively small capacitance, so as to enable the designed circuit to achieve the original performance and precision.

According to one embodiment, a successive approximation ADC (SAR ADC) with capacitance mismatch calibration is provided. The SAR ADC includes a first digital to analog converter (DAC), a SAR control logic ("SAR"), a comparator and a digital error correction logic. The first digital to analog converter (DAC) comprises a first array of capacitors with binary weighted values and at least two first compensating capacitors, wherein the first compensating capacitors are binary scaled. The SAR control logic is configured to select a capacitor from the first array of capacitors as a capacitor-under-test and then control the terminal voltages on the terminals of the first array of capacitors and the first compensating capacitors accordingly to generate a first comparison voltage of the first DAC. The comparator, coupled between the first DAC and the SAR control logic, is configured to output a comparison result based on the first comparison voltage and a second comparison voltage. The digital error correction logic is coupled to the SAR control logic. Wherein, the SAR control logic controls a sequence of comparisons based on the comparison result to output the corresponding digital bits, and the digital error correction logic calculates a calibration value to calibrate the value of the capacitor-under-test according to the digital bits.

According to another embodiment, a capacitance mismatch calibrating method for a successive approximation ADC which includes at least one array of capacitors is provided. The method comprises the following steps: firstly, at least two compensating capacitors are configured. A capacitor from the array of capacitors is selected as a capacitor-under-test. Then, the terminal voltages on the terminals of the array of capacitors and on the terminals of the compensating capacitors are determined. A first comparison voltage is outputted based on the determined terminal voltages. Afterwards, a sequence of comparisons is controlled based on the first comparison voltage and a second comparison voltage to output a sequence of corresponding digital bits. Finally, a calibration value is calculated to calibrate the value of a capacitor-under-test according to the digital bits.

BRIEF DESCRIPTION OF THE DRAWINGS

FIG. 4 illustrates the implementation of the successive approximation ADC in sample phase according to one embodiment of the present invention;

FIGS. 5A-5F illustrate the implementations of the successive approximation ADC in comparison phases according to one embodiment of the present invention;

FIG. 6 illustrates the converted digital bits; and

DETAILED DESCRIPTION OF THE INVENTION

Figure 1:
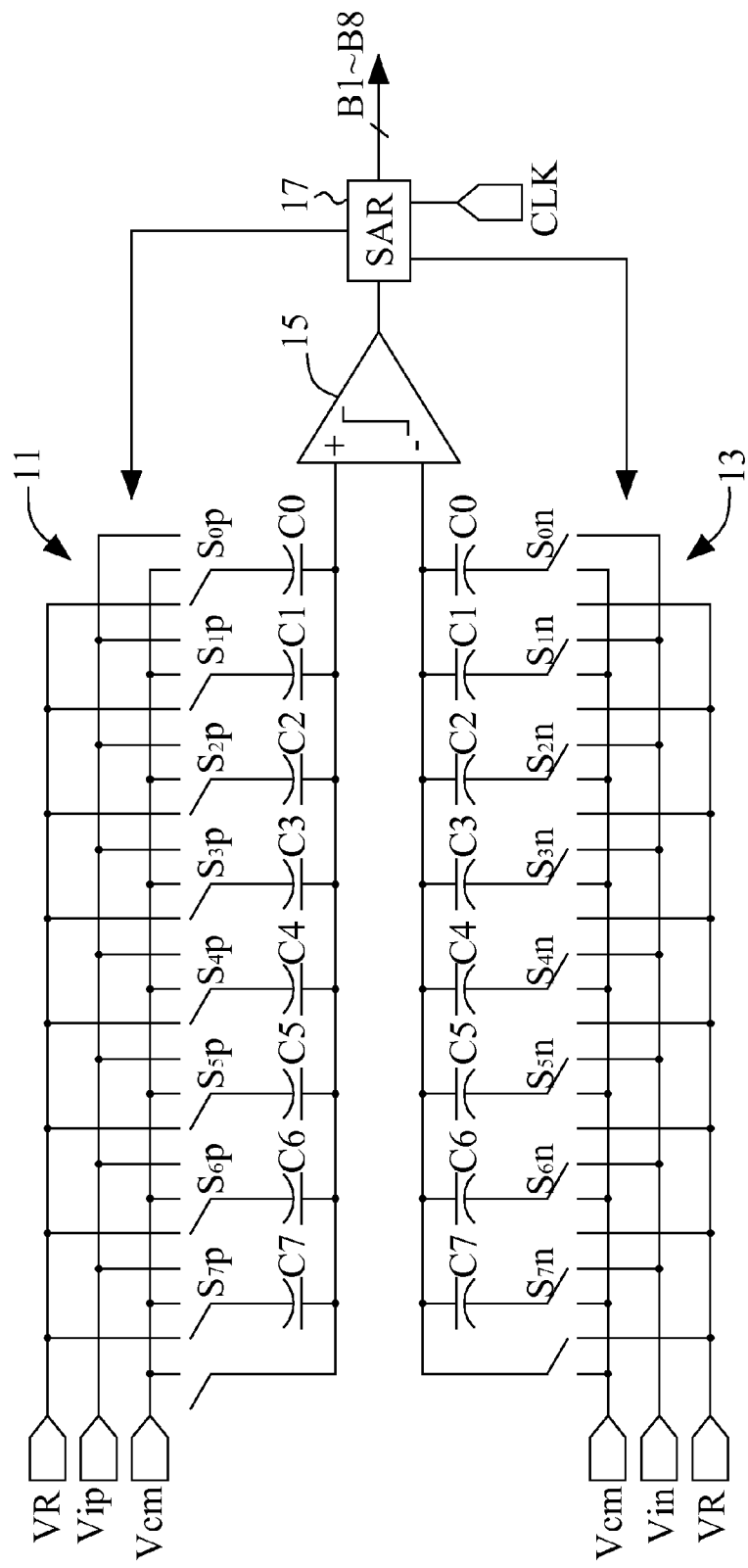
FIG. 1 illustrates a conventional 8-bit successive approximation register (SAR) ADC.
Figure 2A:
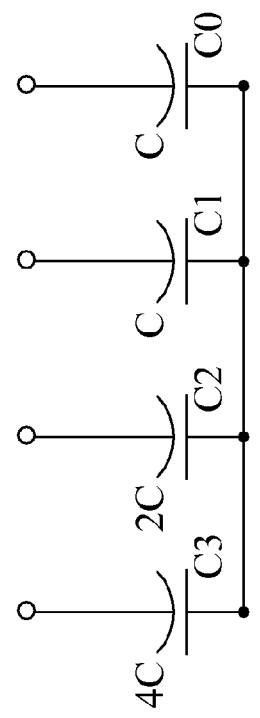
FIG. 2A illustrates an array of capacitors with perfect capacitance match.
Figure 2B:
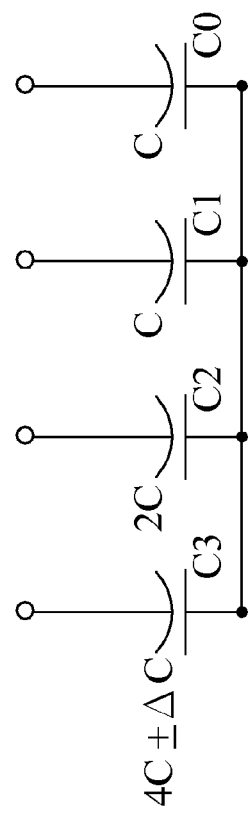
FIG. 2B illustrates an array of capacitors with capacitance mismatch.
Figure 3:
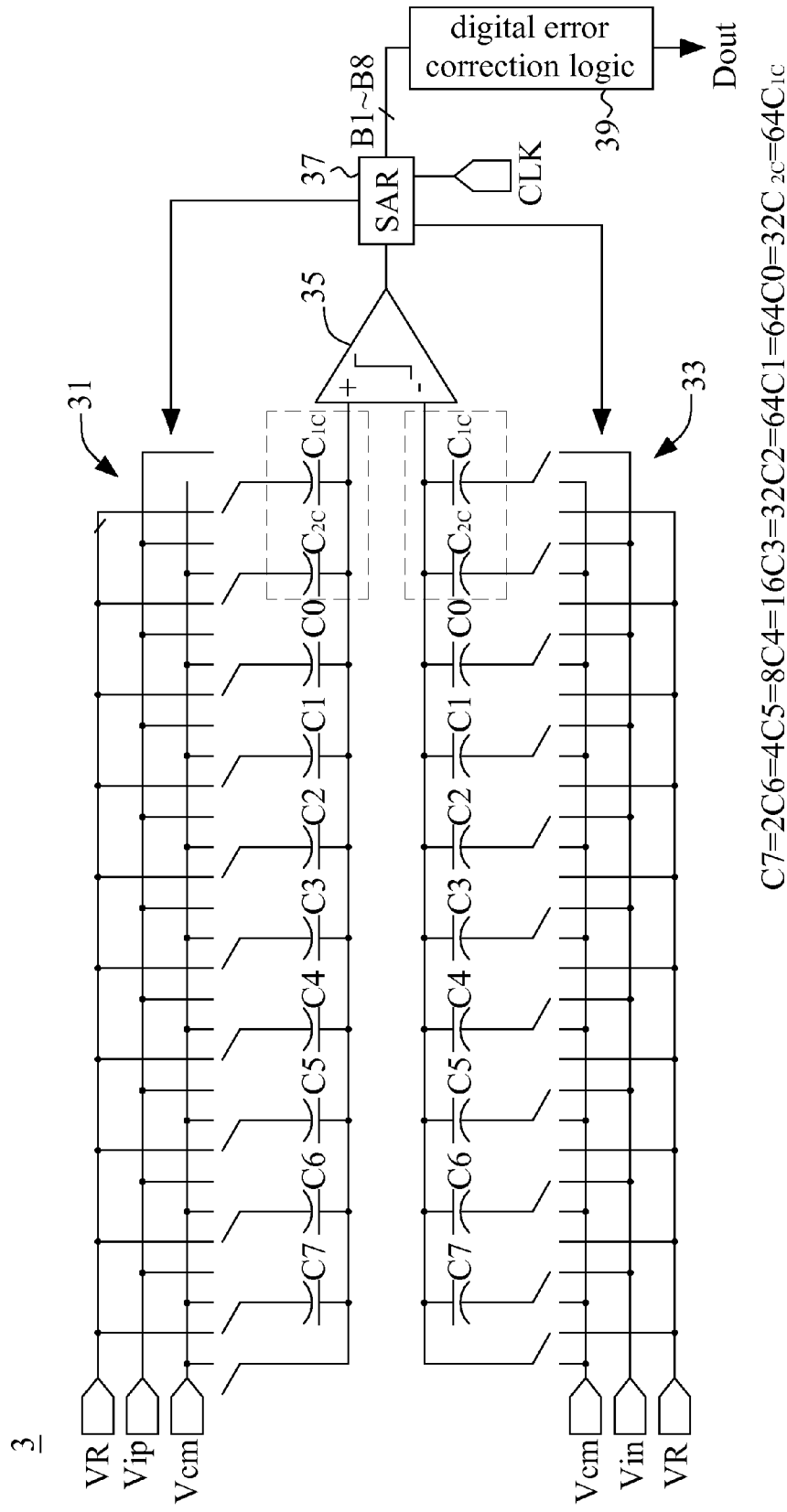
FIG. 3 illustrates a successive approximation ADC for calibrating capacitance mismatch according to one embodiment of the present invention.
Figure 5B:
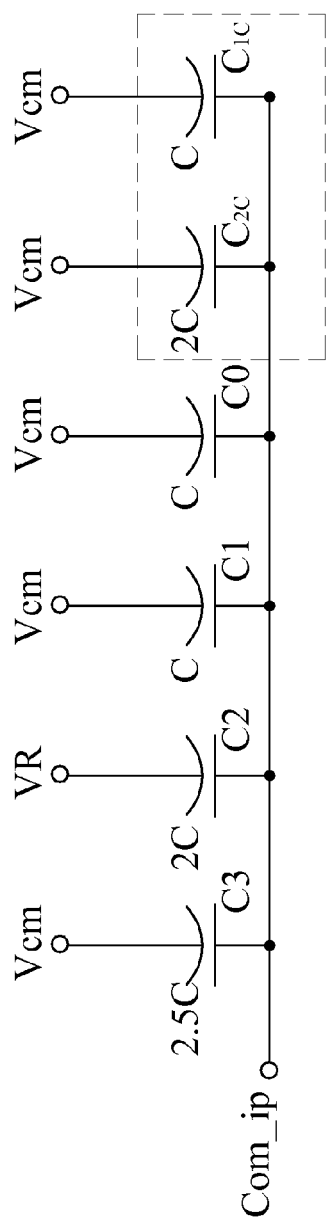
Figure 5C:
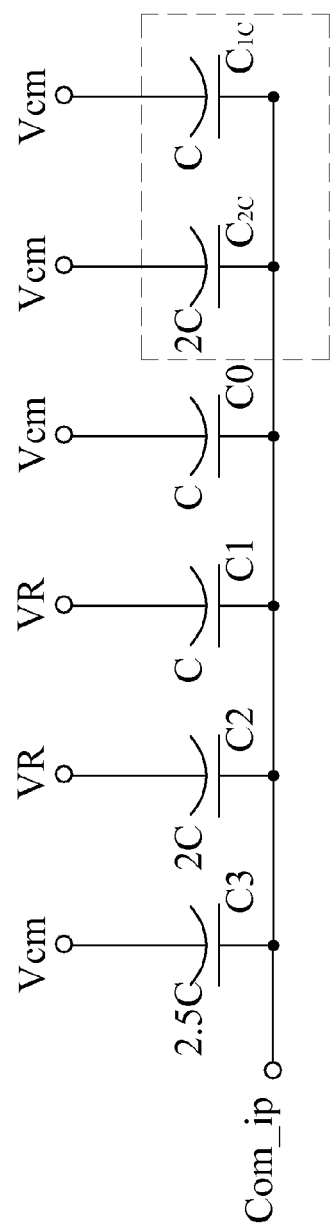

Firstly, with reference to the drawings, FIG. 3 illustrates a successive approximation ADC (SAR ADC) 3 for calibrating capacitance mismatch according to one embodiment of the present invention. As shown in FIG. 3, the SAR ADC 3 includes a first digital to analog converter (DAC) 31, a second digital to analog converter (DAC) 33, a comparator 35, a SAR control logic ("SAR") 37 and a digital error correction logic 39. The first DAC 31 includes a first array of capacitors C7 to C0 and at least two first compensating capacitors $C_{2C}$ and $C_{1C}$. Similarly, the second DAC 33 includes a second array of capacitors C7 to C0 and at least two second compensating capacitors $C_{2C}$ and $C_{1C}$. In a perfect situation, the first and second arrays of capacitors are with binary weighted values:

$$C7=2C6=4C5=8C4=16C3=32C2=64C1=64C0$$

The comparator 35 has an inverting input terminal and a non-inverting (e.g., positive) input terminal which receive the outputs of the first DAC 31 and the second DAC 33, respectively, and then compare them. The SAR 37 is configured to control the terminal voltages on the terminals of the arrays of capacitors C7 to C0 and on the compensating capacitors $C_{2C}$ and $C_{1C}$, and convert the corresponding digital bits B1 to B8 based on the comparison result of the comparator 35. The digital error correction logic 39, coupled to the SAR 37, corrects and integrates the digital bits B1 to BN to output a complete N-bit code, where N is the ADC resolution.

In order to calibrate capacitance mismatch, before regularly operating the SAR ADC 3, the actual weighted values of the arrays of capacitors C7 to C0 must be recognized by the mechanism provided in the present invention in advance, so as to convert correct digital output. FIG. 4 takes the capacitors C3 to C0 for brevity in the first DAC 31 for example to facilitate understanding. In one embodiment, the first compensating capacitors $C_{2C}$ and $C_{1C}$ may be configured in back of the capacitor C0, and their values (capacitances) are 2C and C, respectively. It needs to determine a capacitor-under-test such as capacitor C3 firstly, and assume that the actual value of the capacitor C3 is deviated as 2.5C rather than the idea value, 4C, as shown in FIG. 4. The mechanism provided in the present invention should calibrate it.

In a sample phase, the capacitors C7 to C0 and the compensating capacitors $C_{2C}$ and $C_{1C}$ are reset to a common voltage $V_{cm}$ by SAR 37, and the SAR 37 further controls the capacitor (capacitor-under-test) C3 to couple to a positive reference voltage VR by connecting the switch. The capacitors C7 to C0 and the compensating capacitors $C_{2C}$ and $C_{1C}$ of the second DAC 33 are symmetrically operated with the first DAC 31. Therefore, the capacitor (capacitor-under-test) C3 of the second DAC 33 is controlled to couple to a negative reference voltage −VR.

After the sample phase, it enters into a sequence of comparison phases, as shown in FIGS. 5A-5F. In the first comparison phase, the SAR 37 controls the capacitor C3 to couple to the common voltage $V_{cm}$. Due to the change of the terminal voltages, the redistributed charges generate new voltage (first comparison voltage Com_ip) on the non-inverting (e.g., positive) input terminal of the comparator 35. The comparison voltage Com_ip in this phase is equal to $2.5C*(V_{cm}-VR)/C_{tot}$. For brevity, the common voltage $V_{cm}$ is set as "0" thereafter so the first comparison voltage Com_ip is $-2.5C*VR/C_{tot}$, where $C_{tot}$ is the total capacitance value of the capacitors C7 to C0, $C_{2C}$ and $C_{1C}$. Because the present first comparison voltage Com_ip is negative (i.e., the present first comparison voltage Com_ip is lower than the comparison voltage of the inverting input terminal (second comparison voltage)), the comparison result outputted from the comparator 35 is logic "0". Wherein, the SAR 37 also controls the terminal voltages on the terminals of the second array of capacitors C7 to C0 and the second compensating capacitors $C_{2C}$ and $C_{1C}$ accordingly to generate the second comparison voltage of the second DAC 33, and the second DAC 33 is symmetrically operated with the first DAC 31 in the sample phase and the sequence of comparison phases.

In order to control the difference between the first comparison voltage Com_ip and the second comparison voltage to approximate to "0", the SAR 37 sequentially controls the terminal voltages of the capacitors based on the comparison result in last phase. Therefore, when entering into the second comparison phase, the SAR 37 controls the capacitor C2 to couple to the positive reference voltage VR, so as to increase the first comparison voltage Com_ip. The first comparison voltage Com_ip in this phase is equal to $(-2.5C*VR+2*VR)/C_{tot}$. Meanwhile, the capacitor C2 of the second DAC 33 is controlled to couple to the negative reference voltage −VR and the second comparison voltage of the inverting input terminal of the comparator 35 is $0.5C*VR/C_{tot}$. Because the present first comparison voltage Com_ip is negative (i.e., the present first comparison voltage Com_ip is lower than the second comparison voltage of the inverting input terminal), the comparison result outputted from the comparator 35 is logic "0", and the digital bit B1 converted by SAR 37 is "0" based on the comparison result.

Sequentially, it enters into the third comparison phase. The first comparison voltage Com_ip in last phase is still negative; therefore, the SAR 37 controls the capacitor C1 to couple to the positive reference voltage VR, so as to increase the first comparison voltage Com_ip. The first comparison voltage Com_ip in this phase is equal to $(-0.5C*VR+1*VR)/C_{tot}$. Meanwhile, the capacitor C1 of the second DAC 33 is controlled to couple to the negative reference voltage −VR and the second comparison voltage of the inverting input terminal of the comparator 35 is $-0.5C*VR/C_{tot}$. Because the present first comparison voltage Com_ip is positive (i.e., the present first comparison voltage Com_ip is higher than the second comparison voltage of the inverting input terminal), the comparison result outputted from the comparator 35 is logic "1", and the digital bit B2 converted by SAR 37 is "1".

The first comparison voltage Com_ip in last phase is positive, therefore, when entering the fourth comparison phase, the SAR 37 controls the capacitor C0 to couple to the negative reference voltage −VR, so as to decrease the first comparison voltage Com_ip. The first comparison voltage Com_ip in this phase is equal to $(0.5C*VR-1*VR)/C_{tot}$. Meanwhile, the capacitor C0 of the second DAC 33 is controlled to couple to the positive reference voltage VR and the second comparison voltage of the inverting input terminal of the comparator 35 is $0.5C*VR/C_{tot}$. Because the first present comparison voltage Com_ip is negative (i.e., the present first comparison voltage Com_ip is lower than the second comparison voltage of the inverting input terminal), the comparison result outputted from the comparator 35 is logic "0", and the digital bit B3 converted by SAR 37 is "0" based on the present comparison result.

Similarly, when entering into the fifth comparison phase, the SAR 37 controls the compensating capacitors $C_{2C}$ to couple to the positive reference voltage VR, so as to increase the first comparison voltage Com_ip. The first comparison voltage Com_ip in this phase is equal to $(-0.5C*VR+2*VR)/C_{tot}$. Meanwhile, the capacitor $C_{2C}$ of the second DAC 33 is controlled to couple to the negative reference voltage −VR and the second comparison voltage of the inverting input terminal of the comparator 35 is $-1.5C*VR/C_{tot}$. Because the present first comparison voltage Com_ip is positive (i.e., the present first comparison voltage Com_ip is higher than the second comparison voltage of the inverting input terminal), the comparison result outputted from the comparator 35 is logic "1", and the digital bit B4 converted by SAR 37 is "1" based on the present comparison result.

Finally, when entering into the sixth comparison phase, the SAR 37 controls the compensating capacitors $C_{1C}$ to couple to the negative reference voltage −VR, so as to decrease the first comparison voltage Com_ip. The first comparison voltage Com_ip in this phase is equal to $(1.5C*VR−1*VR)/C_{tot}$. Meanwhile, the capacitor $C_{1C}$ of the second DAC 33 is controlled to couple to the positive reference voltage VR and the second comparison voltage of the inverting input terminal of the comparator 35 is $−0.5C*VR/C_{tot}$. Because the present first comparison voltage Com_ip is positive (i.e., the present first comparison voltage Com_ip is higher than the second comparison voltage of the inverting input terminal), the comparison result outputted from the comparator 35 is logic "1", and the digital bit B5 converted by SAR 37 is "1" based on the present comparison result.

After a sequence of comparison phases, the SAR 37 converts the corresponding digital bits B5 to B1, as shown in FIG. 6. The digital error correction logic 39 calculates a calibration value (i.e., index) to calibrate the value of the capacitor C3 according to the following determining rules (2), (3).

$$\text{If } B4=B5=!B3 \cdot \text{index}=-(2*B1+B2) \quad (2)$$

$$\text{If } B1=B2=!B3 \cdot \text{index}=-(2*B4+B5) \quad (3)$$

The above example of the present invention conforms to the determining rules (2), and the calculated calibration value (index) is (−1) accordingly. The digital error correction logic 39 then adds up the idea value (=4C) of the capacitor C3 and the corresponding calibration value (=−1C) to obtain the actual (or estimative) weighted value (4C−1C=3C) of the capacitor C3. Accordingly, the digital error correction logic 39 multiplies the converted digital bits Bi by the calibrated weighted values of the capacitors to generate the digital output Dout by equation (4). It is noted that it sometimes exists few inaccuracy about 0.5C between the calibrated value and the actual value of the capacitor, however, the performance and precision of the circuit still are improved as a whole.

$$Dout=3*B3+2*B2+B1 \quad (4)$$

After calibrating the value of the capacitor C3, the capacitor C4 can be calibrated as well by repeating the above operations. Accordingly, the capacitors are calibrated in order from the capacitor with smaller value to the capacitor with larger value until all the capacitors have been calibrated so as to obtain the calibration values of the capacitors. The calibration values of the capacitors are used to obtain the corresponding actual weighted values of the capacitors. Therefore, the digital error correction logic 39 can obtain more precise digital output Dout based on the corresponding actual weighted values of the capacitors. In practice, the calibration is executed before the SAR ADC 3 converts an analog signal to a digital code.

In one embodiment, the compensating capacitors $C_{2C}$ and $C_{1C}$ are binary scaled, and the more the number of compensating capacitors is, the larger the calibration range of the capacitor-under-test is. For example, if configuring two compensating capacitors, the range of the calibration value (index) is −3 to 3; and if configuring five compensating capacitors, the range of the calibration value (index) is $−(2^5−1)$ to $(2^5−1)$, and so on.

Figure 7B:
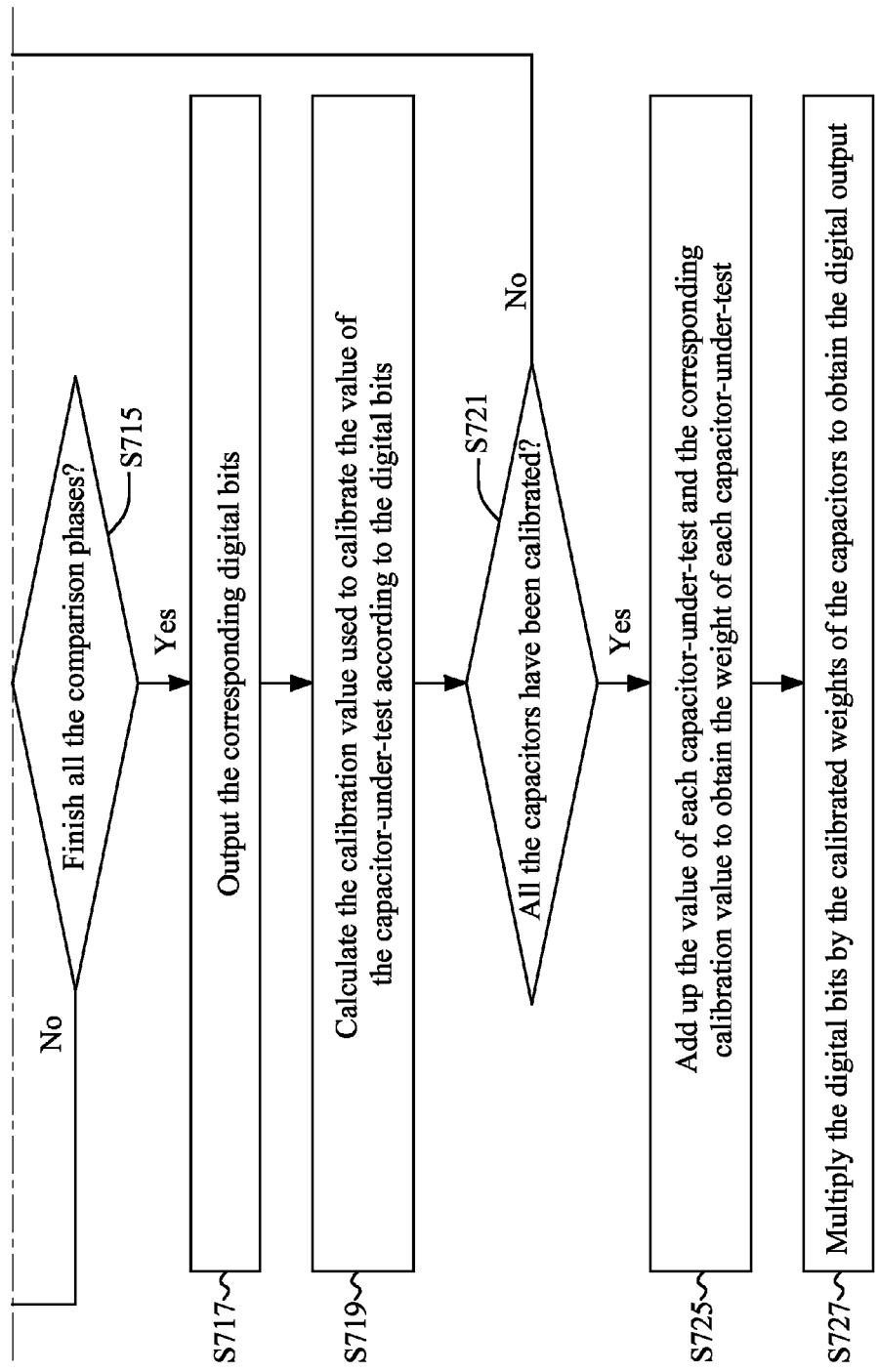
FIG. 7 shows a flow diagram illustrating a capacitance mismatch calibrating method according to one embodiment of the present invention.

Finally, with reference to FIG. 7, a flow diagram is provided illustrating a capacitance mismatch calibrating method according to one embodiment of the present invention. It is noted that FIG. 7 shows the flow of the first DAC 31 for brevity, and the second DAC 33 are symmetrically operated with the first DAC 31 as described above. The method is for the SAR ADC 3 in FIG. 3 which configures the compensating capacitors $C_{2C}$ and $C_{1C}$ in back of the array of capacitors C7 to C0.

Firstly, in step S701, the first capacitor-under-test needed to be calibrated, e.g. capacitor C3, from the array of capacitors C7 to C0 is determined. Then, it enters into the sample phase, the SAR 37 resets the capacitors C7 to C0 and the compensating capacitors $C_{2C}$ and $C_{1C}$ to the common voltage $V_{cm}$ and controls the capacitor-under-test to couple to the positive reference voltage VR in step S703. Afterwards, in step S705, it enters into a sequence of comparison phases. Wherein, in the first comparison phase, the SAR 37 controls the capacitor-under-test to couple to the common voltage $V_{cm}$. And in step S707, the DAC 31 outputs the first comparison voltage Com_ip based on the determined terminal voltages.

In step S709, the comparator 35 determines whether the first comparison voltage Com_ip is positive or not. If it is, in step S711, the outputted comparison result is logic "1", and the SAR 37 controls the capacitor C2, which is the capacitor in back of the capacitor-under-test, to couple to the positive reference voltage VR. If the first comparison voltage Com_ip is negative, in step S713, the outputted comparison result is logic "0", and the SAR 37 controls the capacitor C2 to couple to the negative reference voltage −VR.

In step S715, it determines whether all the comparison phases have been finished or not. If no, flow returns to step S707 so as to proceed the following comparison phases. If finishing all the comparison phases, the SAR 37 outputs the corresponding digital bits B1 to B5 based on each outputted comparison result, in step S717. In step S719, the digital error correction logic 39 calculates the calibration value (i.e., index), used to calibrate the value of the capacitor-under-test, based on the converted digital bits B1 to B5 in light of the determining rules (2), (3).

In step S721, it determines that whether all the capacitors larger than the first capacitor-under-test have been calibrated or not. If not, in step S723, it selects the next capacitor-under-test (i.e., capacitor C4 which is the capacitor in front of the last capacitor-under-test), and flow returns to step S703 so as to repeat the above operations until all capacitors have been calibrated. After calibrating all capacitors, in step S725, the digital error correction logic 39 adds up the value of each capacitor-under-test and the corresponding calibration value (i.e., index) to obtain the actual weighted value of each capacitor-under-test. Finally, in step S727, the digital error correction logic 39 multiplies the converted digital bits B1 to BN by the calibrated weighted values of the capacitors to obtain the digital output Dout during an analog to digital conversion.

According to the above embodiment, the successive approximation ADC for calibrating capacitance mismatch and method thereof, provided in the present invention, add the compensating capacitors with relatively small capacitance to find the actual weighted values of the array of capacitors by the mechanism provided in the present invention. Therefore, it can compensate for or calibrate the capacitance mismatch caused by deviation in the manufacturing process with relatively small capacitance, so as to enable the designed circuit to achieve the original performance and precision.

Although specific embodiments have been illustrated and described, it will be appreciated by those skilled in the art that various modifications may be made without departing from the scope of the present invention, which is intended to be limited solely by the appended claims.

What is claimed is:

1. A successive approximation ADC (SAR ADC) with capacitance mismatch calibration, comprising:
a first digital to analog converter (DAC) comprising a first array of capacitors with binary weighted values and at least two first compensating capacitors, wherein the first compensating capacitors are binary scaled;
a SAR control logic configured to select a capacitor from the first array of capacitors as a capacitor-under-test and then control the terminal voltages on the terminals of the first array of capacitors and the first compensating capacitors accordingly to generate a first comparison voltage of the first DAC;
a second digital to analog converter (DAC) comprising a second array of capacitors with binary weighted values and at least two second compensating capacitors with binary weighted values; wherein, the SAR control logic configured to control the terminal voltages on the terminals of the second array of capacitors and the second compensating capacitors accordingly to generate a second comparison voltage of the second DAC;
a comparator, coupled between the first DAC and the SAR control logic, configured to output a comparison result based on the first comparison voltage and the second comparison voltage; and
a digital error correction logic coupled to the SAR control logic;
wherein, the SAR control logic controls a sequence of comparisons based on the comparison result to output the corresponding digital bits, and the digital error correction logic calculates a calibration value to calibrate the value of the capacitor-under-test according to the digital bits;
wherein the SAR control logic resets the first array of capacitors and the first compensating capacitors to a common voltage and controls the capacitor-under-test to couple to a first reference voltage in a sample phase;
wherein the SAR control logic controls the terminal voltages on the terminals of the capacitors based on the comparison result in a sequence of comparison phases, so as to control a difference between the first comparison voltage and the second comparison voltage to approximate to "0"; and
wherein the second DAC is symmetrically operated with the first DAC in the sample phase and the sequence of comparison phases.

2. The SAR ADC of claim 1, wherein in the sequence of comparison phases, the SAR control logic controls a back capacitor to couple to the first reference voltage or a second reference voltage based on the comparison result outputted from the comparator.

3. The SAR ADC of claim 2, wherein in the first comparison phase, the SAR control logic controls the capacitor-under-test to couple to the common voltage.

4. The SAR ADC of claim 3, wherein the digital error correction logic determines if B4=B5=!B3, the calculated calibration value is −(2*B1+B2), or if B1=B2=!B3, the calculated calibration value is (2*B4+B5), where B1 to B5 are the digital bits.

5. The SAR ADC of claim 4, wherein the digital error correction logic adds up the idea value of the capacitor-under-test and the corresponding calibration value to obtain the actual weighted value of the capacitor-under-test.

6. The SAR ADC of claim 5, wherein the capacitors are calibrated in order from the capacitor with smaller value to the capacitor with larger value, and the digital error correction logic multiplies the digital bits by the calibrated weighted value of each capacitor to obtain a digital output during an analog to digital conversion.

7. A capacitance mismatch calibrating method for a successive approximation ADC (SAR ADC) which comprises at least one array of capacitors, and the method comprising:
configuring at least two compensating capacitors;
selecting a capacitor from the array of capacitors as a capacitor-under-test;
determining the terminal voltages on the terminals of the array of capacitors and on the terminals of the compensating capacitors;
outputting a first comparison voltage based on the determined terminal voltages;
outputting a comparison result based on the first comparison voltage and a second comparison voltage;
controlling a sequence of comparisons based on the comparison result to output a sequence of corresponding digital bits; and
calculating a calibration value to calibrate the value of the capacitor-under-test according to the digital bits.

8. The method of claim 7, wherein the step of determining the terminal voltages comprises:
resetting the array of capacitors and the compensating capacitors to a common voltage and controlling the capacitor-under-test to couple to a first reference voltage in a sample phase; and
controlling the terminal voltages on the terminals of the capacitors based on the comparison result in a sequence of comparison phases, so as to control a difference between the first comparison voltage and the second comparison voltage to approximate to "0".

9. The method of claim 8, wherein the step of outputting the comparison result based on the comparison voltages comprises:
determining if the first comparison voltage is higher than the second comparison voltage, the outputted comparison result is logic "1"; and
determining if the first comparison voltage is lower than the second comparison voltage, the outputted comparison result is logic "0".

10. The method of claim 9, wherein the step of controlling the sequence of comparisons comprises:
controlling a back capacitor of the capacitor-under-test to couple to the first reference voltage or a second reference voltage based on the comparison result.

11. The method of claim 10, wherein the step of calculating the calibration value comprises:
determining if B4=B5=!B3, the calculated calibration value is −(2*B1+B2);
determining if B1=B2=!B3, the calculated calibration value is (2*B4+B5); and
adding up the idea value of the capacitor-under-test and the corresponding calibration value to obtain the actual weighted value of the capacitor-under-test;
where B1 to B5 are the digital bits (Bi).

12. The method of claim 11, further comprising:
calibrating the capacitors in order from the capacitor with smaller value to the capacitor with larger value; and
multiplying the digital bits (Bi) by the calibrated weighted value of each capacitor to obtain a digital output.

* * * * *